United States Patent
Akaike et al.

(10) Patent No.: US 8,729,978 B2
(45) Date of Patent: May 20, 2014

(54) QUARTZ-CRYSTAL CONTROLLED OSCILLATOR

(75) Inventors: Kazuo Akaike, Saitama (JP); Tsukasa Kobata, Saitama (JP); Tomoya Yorita, Saitama (JP); Kaoru Kobayashi, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 13/562,270

(22) Filed: Jul. 30, 2012

(65) Prior Publication Data

US 2013/0033332 A1 Feb. 7, 2013

(30) Foreign Application Priority Data

Aug. 1, 2011 (JP) .................. 2011-168764
Jul. 26, 2012 (JP) .................. 2012-166021
Jul. 26, 2012 (JP) .................. 2012-166032

(51) Int. Cl.
*H03B 5/36* (2006.01)

(52) U.S. Cl.
USPC ... 331/176; 331/158; 331/116 R; 331/116 FE

(58) Field of Classification Search
USPC ............. 331/158, 116 R, 116 FE, 176, 2
See application file for complete search history.

(56) References Cited

U.S. PATENT DOCUMENTS 5,200,714 A * 4/1993 Hayashi .................. 331/66

FOREIGN PATENT DOCUMENTS

| JP | 2001-292030 | 10/2001 |
| JP | 2007-108170 | 4/2007 |
| JP | 2009-206792 | 9/2009 |
| JP | 2011-188373 | 9/2011 |
| JP | 2011-252932 | 12/2011 |

* cited by examiner

*Primary Examiner* — Arnold Kinkead
(74) *Attorney, Agent, or Firm* — Jianq Chyun IP Office

(57) ABSTRACT

An atmosphere temperature at which a quartz-crystal oscillator and an oscillation circuit are placed is controlled in high accuracy, and an output frequency with high stability is obtained. If oscillation outputs of first and second quartz-crystal oscillators are set to f1 and f2, and oscillation frequencies of the oscillation outputs at a reference temperature are set to f1$r$ and f2$r$, respectively, $\{(f2-f1)/f1\}-\{(f2r-f1r)/f1r\}$ is calculated by a frequency difference detection unit. A digital value can be obtained by representing this value by 34-bit digital value, corresponding to a temperature. Therefore, this value is treated as a temperature detection value, a difference with a temperature set value is supplied to the loop filter, and the digital value therefrom is converted into a direct-current voltage to control a heater.

9 Claims, 17 Drawing Sheets (a) OUTPUT OF DDS, LATCH POINT (b) OUTPUT OF LATCH (c) OUTPUT OF LOOP FILTER (a)

(b)

US 8,729,978 B2

QUARTZ-CRYSTAL CONTROLLED OSCILLATOR

CROSS-REFERENCE TO RELATED APPLICATIONS

This application claims the priority benefit of Japan application serial no. 2011-168764, filed on Aug. 1, 2011, Japan application serial no. 2012-166021, filed on Jul. 26, 2012, and Japan application serial no. 2012-166032, filed on Jul. 26, 2012. The entirety of each of the above-mentioned patent applications is hereby incorporated by reference herein and made a part of this specification.

BACKGROUND OF THE INVENTION

1. Field of the Invention

The present invention relates to a quartz-crystal controlled oscillator detecting an atmosphere temperature at which a quartz-crystal oscillator is placed, and controlling a heating unit based on a detection result of the temperature to keep the atmosphere temperature at a constant temperature.

2. Description of the Related Art

Normally, when a quartz-crystal controlled oscillator is incorporated in an application to which quite high frequency stability is required, an oven controlled crystal oscillator (OCXO) is generally used. Although temperature control in OCXO is structured by using discrete parts (e.g. an operational amplifier, resistance, and a capacitor) using a thermistor as a temperature sensor, it was not possible to perform temperature control over a range of ±20 m° C., for example, due to variation and aged deterioration of respective analog parts.

However, it is required that a quite high-stability clock signal should be used in a base station, a repeater station, etc. at a relatively low cost. For this reason, a situation to be difficult for the conventional OCXO to support is expected.

In FIG. 2 and FIG. 3 of Patent Document 1, it is described to structure two quartz-crystal oscillators (quartz-crystal resonators) by providing two pairs of electrodes on a common quartz-crystal piece. Further, paragraph 0018 describes that a frequency difference appears between the two quartz-crystal oscillators in accordance with a temperature change, and measuring of this frequency difference is equivalent to measuring of temperature. Further, a relation between this frequency difference Δf and an amount of frequency to be compensated is stored in a ROM, and an amount of frequency compensation is read based on Δf. However, this method is related to a temperature compensated crystal oscillator (TCXO) compensating an oscillation frequency based on a detected temperature, but is not related to the OCXO.

Further, as described in paragraph 0019, this method is required to adjust the quartz-crystal oscillators so that, regarding a desired output frequency f0 and respective frequencies f1, f2 of the two quartz-crystal oscillators, a relation of f0≈f1≈f2 is satisfied, and thus there are problems that a manufacturing process of the quartz-crystal oscillators becomes complicated, and besides, it is not possible to achieve high yield. Furthermore, clocks being frequency signals from the respective quartz-crystal oscillators are counted for a given period of time, and a difference between the clocks (f1−f2) is determined, so that a detection accuracy directly influences on a detection time, which makes it difficult to realize high-accuracy temperature compensation.

[Patent Document 1] Japanese Patent Application No. 2001-292030

SUMMARY OF THE INVENTION

The present invention has been made under such a circumstances and an object thereof is to providing a quartz-crystal controlled oscillator capable of obtaining an oscillation output with the high stability frequency in a quartz-crystal controlled oscillator (e.g., OCXO) detecting an atmosphere temperature at which a quartz-crystal oscillator is placed, and controlling a heating unit based on a detection result of the temperature to keep the atmosphere temperature at a constant temperature.

The present invention is characterized to be structured such that, in a quartz-crystal controlled oscillator detecting an atmosphere temperature at which a quartz-crystal oscillator is placed, and controlling a heating unit based on a detection result of the temperature to keep the atmosphere temperature at a constant temperature, there are provided: a first quartz-crystal oscillator structured by providing first electrodes on a quartz-crystal piece; a second quartz-crystal oscillator structured by providing second electrodes on a quart-crystal piece; a first oscillation circuit and a second oscillation circuit connected to the first quartz-crystal oscillator and the second quartz-crystal oscillator, respectively a frequency difference detecting unit determining, when an oscillation frequency of the first oscillation circuit is set to f1, an oscillation frequency of the first oscillation circuit at a reference temperature is set to f1$r$, an oscillation frequency of the second oscillation circuit is set to f2, and an oscillation frequency of the second oscillation circuit at the reference temperature is set to f2$r$, a value corresponding to a difference value between a value corresponding to a difference between f1 and f1$r$, and a value corresponding to a difference between f2 and f2$r$ as a temperature detection value; an adding section obtaining a partial difference between a temperature set value of the atmosphere temperature at which the quartz-crystal oscillator is placed and the temperature detection value, and a circuit section controlling an electric power supplied to the heating unit based on the partial difference obtained in the adding section.

The partial difference obtained in the adding section is integrated by an integration circuit section, for example, and is output to the circuit section.

The first oscillation circuit and the second oscillation circuit apply an overtone to the oscillation output respectively, for example.

The value corresponding to the difference value between the value corresponding to the difference between f1 and f1$r$ and the value corresponding to the difference between f2 and f2$r$ is, for example, $\{(f2-f2r)/f2r\}-(f1-f1r)/f1r\}$. Note that, instead of detecting this value directly, it includes also the case of detecting $\{(f2-f1)/f1\}-\{(f2r-f1r)/f1r\}$ from which a result equivalent to this value can be obtained.

Although the oscillation output of the quartz-crystal controlled oscillator can be applied as one oscillation output of the first oscillation circuit and the second oscillation circuit, for example, it is also possible to provide a third quartz-crystal oscillator placed under the atmosphere different from the first quartz-crystal oscillator and the second quartz-crystal oscillator, and apply the oscillation output from a third oscillation circuit connected to the third quartz-crystal oscillator as the oscillation output of the quartz-crystal controlled oscillator.

Another invention is characterized to be structured such that, an oscillation device includes a quartz-crystal controlled oscillator and a body circuit unit of the oscillation device including a phase locked loop (PLL). The body circuit unit applies an oscillation output of the quartz-crystal controlled oscillator as a clock signal.

In the present invention, if the oscillation outputs of the first and the second oscillation circuits are set to f1 and f2, respectively, and the oscillation frequencies of the first and the second oscillation circuits at the reference temperature are set to f1r and f2r, respectively, a value corresponding to a difference value between the value corresponding to the difference between f1 and f1r and the value corresponding to the difference between f2 and f2r is treated as a temperature at that time. Since the correlation degree between these value and temperature is quite high, the atmosphere temperature on which the quartz-crystal oscillator is placed is quite stabilized by controlling the power supplied to the heating unit by applying the aforementioned value to the temperature detection value. As a result, an oscillation output with high stability can be obtained.

DETAILED DESCRIPTION OF THE PREFERRED EMBODIMENT(S)

Figure 1:
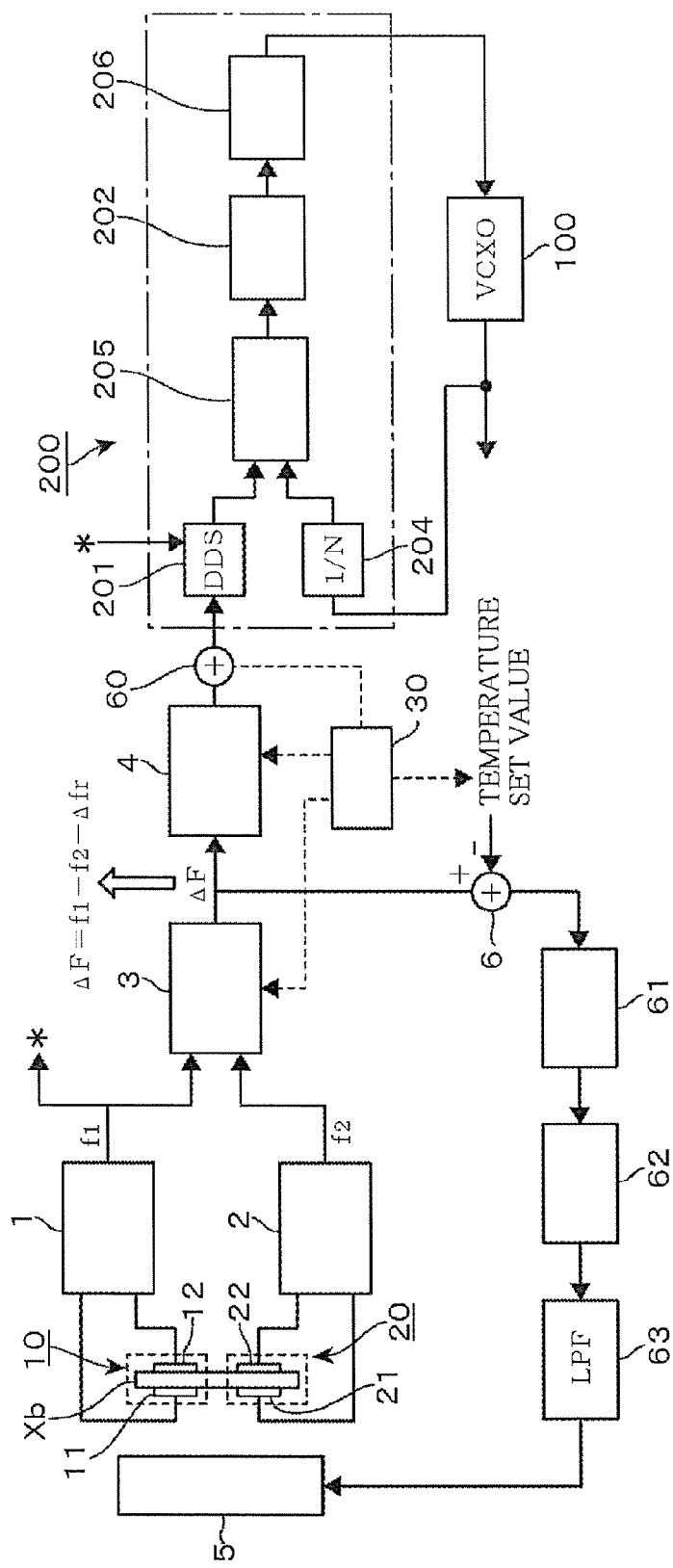
FIG. 1 is a block diagram showing an entire structure of an embodiment of the present invention.

FIG. 1 is a block diagram showing an entire oscillation device structured by applying a quartz-crystal controlled oscillator according to an embodiment of the present invention. This oscillation device is structured as a frequency synthesizer that outputs a frequency signal of a set frequency, and includes a voltage controlled oscillator 100 using a quartz-crystal oscillator, a control circuit unit 200 that structures a PLL in the voltage controlled oscillator 100, a quartz-crystal controlled oscillator (reference numeral is not given) that generates a clock signal for operating a DDS 201 for generating a reference signal of the aforementioned PLL, and a heater 5 being a heating unit for adjusting an atmosphere temperature at which quartz-crystal oscillators 10 and 20 in the quartz-crystal controlled oscillator are placed. Therefore, the quartz-crystal controlled oscillator is an OCXO.

Moreover, this oscillation device also includes a temperature compensation unit that performs temperature compensation of the reference clock input into the control circuit unit 200. Although the reference numeral is not given to the temperature compensation unit, the unit corresponds to a part on the left side of the control circuit unit 200 in FIG. 1, and is shared with a circuit part for controlling the aforementioned heater 5.

The control circuit unit 200 compares, in a phase frequency comparing unit 205, a phase of reference (for reference) clock output from a Direct Digital Synthesizer (DDS) circuit section 201 with a phase of clock as a result of frequency-dividing an output of the voltage controlled oscillator 100 with a frequency divider 204, and a phase difference being a result of the comparison is analog-converted by a charge pump 202. The analog-converted signal is input into a loop filter 206 and controlled so that a Phase locked loop (PLL) is stabilized. Therefore, it is also possible to say that the control circuit unit 200 is a PLL unit. Here, the DDS circuit section 201 uses a frequency signal output from a later-described first oscillation circuit 1 as the reference clock, and frequency data (digital value) for outputting a signal of intended frequency is input therein.

However, a frequency of the reference clock has a temperature characteristic, so that in order to cancel the temperature characteristic, a signal corresponding to a later-described frequency compensation value is added, in an adding section 60, to the frequency data input into the DDS circuit section 201. By compensating the frequency data input into the DDS circuit section 201, the output frequency of the DDS circuit section 201 corresponding to an amount of temperature variation based on an amount of variation in the temperature characteristic of the reference clock is cancelled, resulting in that a frequency of reference clock is stabilized with respect to the temperature variation, and accordingly, an output frequency from the voltage controlled oscillator 100 is stabilized.

In this embodiment, since the quartz-crystal controlled oscillator that creates the reference clock is structured as an OCXO as described below, and therefore a frequency of the reference clock is stable, it can be said that the temperature characteristics of aforementioned reference clock does not come into view. However, there is an advantage that a quite highly reliable frequency synthesizer can be structured by structuring so that the output frequency of the DDS circuit section 201 corresponding to an amount of temperature variation based on the amount of variation in the temperature characteristic of the reference clock is compensated, when a fault of the heater, etc. occurs.

Next, a portion of the OCXO corresponding to the quartz-crystal controlled oscillator of the present invention will be explained. The quartz-crystal controlled oscillator includes a first quartz-crystal oscillator 10 and a second quartz-crystal oscillator 20, and these first quartz-crystal oscillator 10 and second quartz-crystal oscillator 20 are structured by using a common quartz-crystal piece Xb. Specifically, for example, an area of the quartz-crystal piece Xb with a strip shape is divided into two in a longitudinal direction, and excitation electrodes are provided on both front and rear surfaces of the respective divided areas (oscillation areas). Therefore, one divided area and a pair of electrodes 11, 12 form the first quartz-crystal oscillator 10, and the other divided area and a pair of electrodes 21, 22 form the second quartz-crystal oscillator 20. For this reason, it can be said that the first quartz-crystal oscillator 10 and the second quartz-crystal oscillator 20 are thermally coupled.

To the first quartz-crystal oscillator 10 and the second quartz-crystal oscillator 20, a first oscillation circuit 1 and a second oscillation circuit 2 are respectively connected. Each of outputs of these oscillation circuits 1, 2 may be an overtone (harmonic) of each of the quartz-crystal oscillators 10, 20, or may also be a fundamental wave of each of the oscillators, for example. When the output of overtone is obtained, it is also possible to design such that a tuning circuit for overtone is provided in an oscillation loop formed of a quartz-crystal oscillator and an amplifier, for example, and the oscillation loop is oscillated by the overtone. Alternatively, it is also possible to design such that the oscillation loop is oscillated by the fundamental wave, a class C amplifier is provided at a subsequent stage of an oscillation stage, namely, at a subsequent stage of an amplifier being a part of Colpitts circuit, for example, to distort the fundamental wave using the class C amplifier, and a tuning circuit tuned to the overtone is provided at a subsequent stage of the class C amplifier, thereby, as a result, a third overtone oscillation frequency, for instance, is output from each of the oscillation circuits 1, 2.

Here, for convenience, if it is set such that a frequency signal of a frequency f1 is output from the first oscillation circuit 1, and a frequency signal of a frequency f2 is output from the second oscillation circuit 2, the frequency signal of the frequency f1 is supplied to the control circuit unit 200 as a reference clock. Reference numeral 3 denotes a frequency difference detecting unit, and, schematically speaking, this frequency difference detecting unit 3 is a circuit unit for obtaining f2−f1−Δfr, being a difference between a difference between f1 and f2, and Δfr. Δfr is a difference between f1 (f1r) and f2 (f2r) at a reference temperature, which is, for example, 25° C. The difference between f1 and f2 is, for example, several MHz, as an example. The present invention is realized by calculating, with the use of the frequency difference detecting unit 3, ΔF being a difference between a value corresponding to the difference between f1 and f2 and a value corresponding to the difference between f1 and f2 at the reference temperature, which is, for example, 25° C. In a case of this embodiment, more specifically speaking, a value obtained by the frequency difference detecting unit 3 is {(f2−f1)/f1}−{(f2r−f1r)/f1r}. However, a display of an output of the frequency difference detecting unit 3 is briefly described in the drawing.

Figure 2:
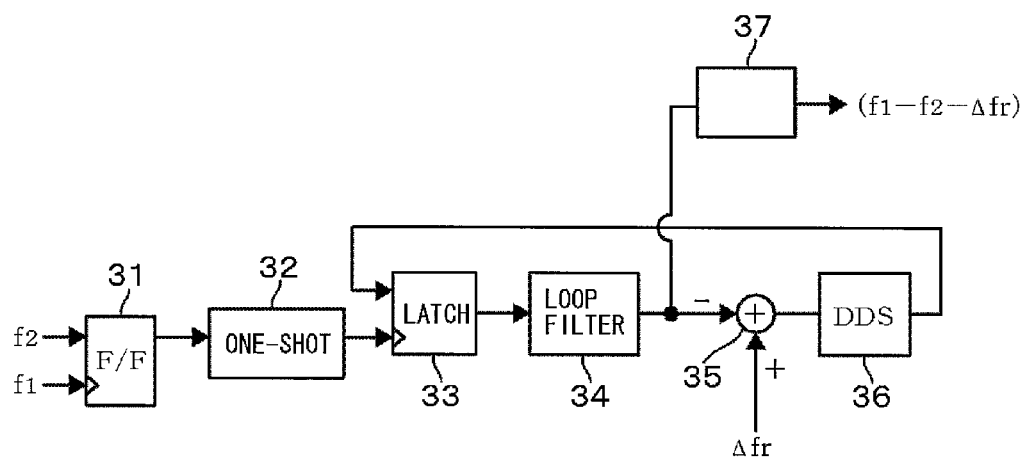
FIG. 2 is a block diagram showing a part of the embodiment of the present invention.

FIG. 2 shows a concrete example of the frequency difference detecting unit 3. Reference numeral 31 denotes a flip-flop circuit (F/F circuit), in which the frequency signal of the frequency f1 from the first oscillation circuit 1 is input into one input end of the flip-flop circuit 31, and the frequency signal of the frequency f2 from the second oscillation circuit 2 is input into the other input end of the flip-flop circuit 31, and the flip-flop circuit 31 latches the frequency signal of the frequency f2 from the second oscillation circuit 2 based on the frequency signal of the frequency f1 from the first oscillation circuit 1. In the description hereinbelow, to avoid the redundancy of description, f1, f2 are treated such that they represent frequencies or frequency signals themselves. From the flip-flop circuit 31, a signal having a frequency of (f2−f1)/f1, being the value corresponding to the frequency difference between f1 and f2 is output.

Figure 3:
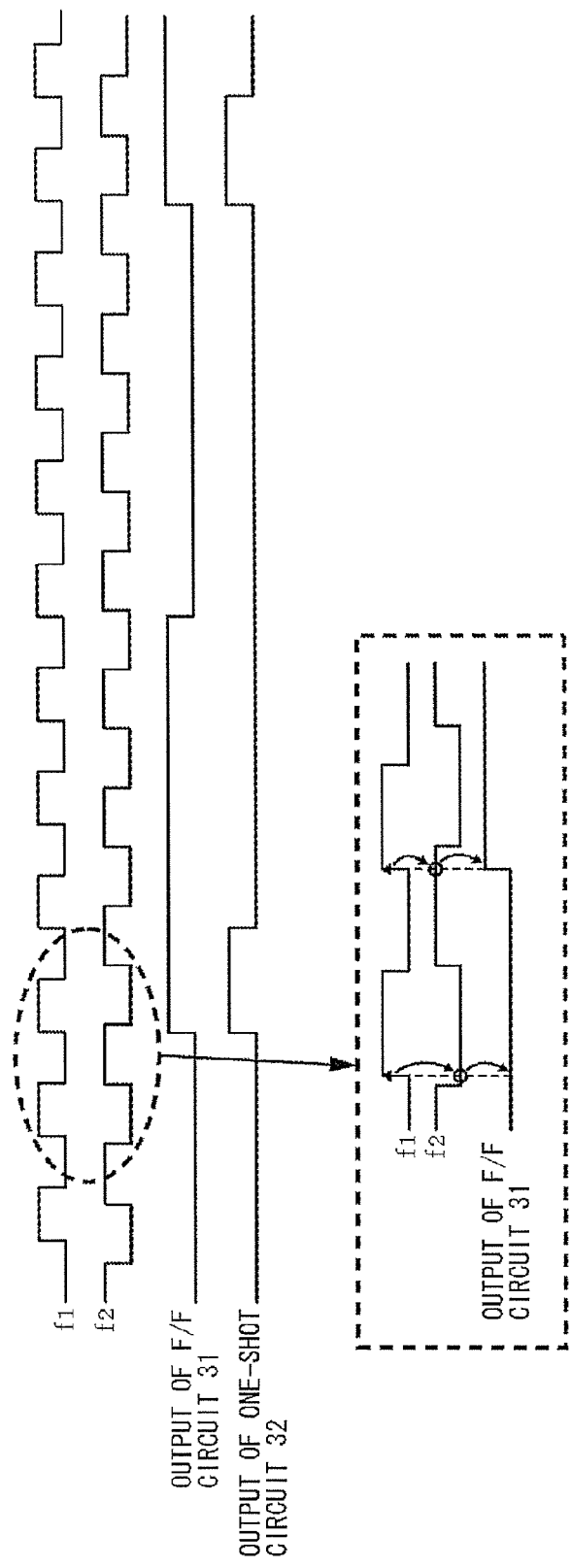
FIG. 3 is a waveform diagram of outputs of a part shown in FIG. 2.

A one-shot circuit 32 is provided at a subsequent stage of the flip-flop circuit 31, and the one-shot circuit 32 outputs a one-shot pulse at a rising edge of a pulse signal obtained from the flip-flop circuit 31. FIG. 3 shows time diagrams showing a series of signals described so far.

At a subsequent stage of the one-shot circuit 32, a Phase Locked Loop (PLL) is provided, and the PLL is structured by a latch circuit 33, a loop filter 34 having an integrating function, an adding section 35 and a DDS circuit section 36. The latch circuit 33 is for latching a saw-tooth wave output from the DDS circuit section 36, based on the pulse output from the one-shot circuit 32, and an output of the latch circuit 33 corresponds to a signal level of the saw-tooth wave at a timing at which the pulse is output. The loop filter 34 integrates a direct-current voltage being the signal level, and the adding section 35 adds this direct-current voltage and a direct current voltage corresponding to Δfr (difference between f1 and f2 at the reference temperature which is, for example, 25° C.). Data of the direct-current voltage corresponding to Δfr is stored in the memory 30 shown in FIG. 2.

Figure 4:
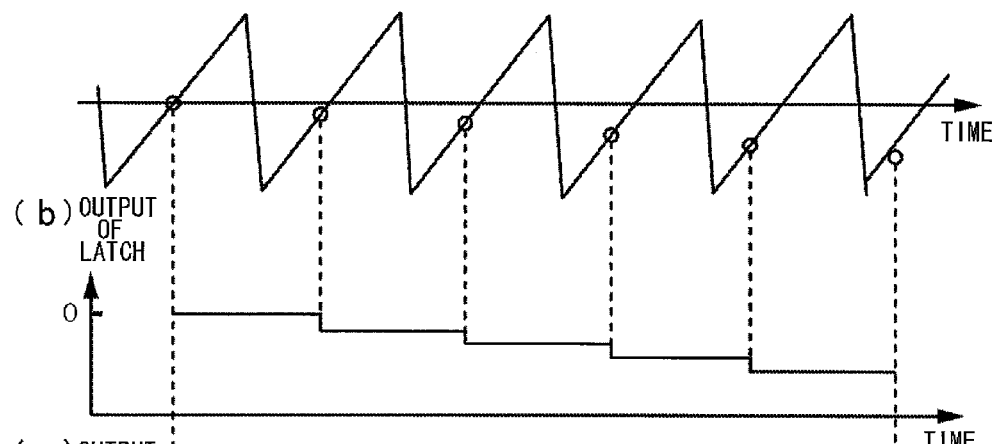
FIGS. 4(a), 4(b) and 4(c) are waveform diagrams of respective sections schematically showing an unlocked state in a loop including a DDS circuit section shown in FIG. 2.
Figure 4:
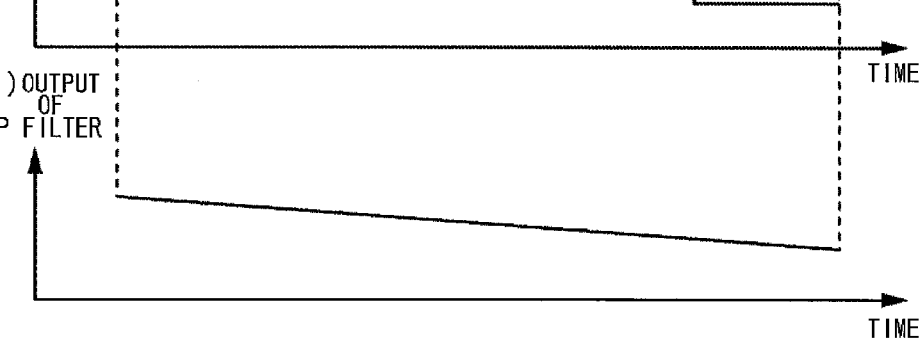

In this example, regarding a sign in the adding section 35, "+" is given to an input side of the direct-current voltage corresponding to Δfr, and "−" is given to an input side of the output voltage of the loop filter 34. To the DDS circuit section 36, a direct-current voltage calculated by the adding section 35, namely, a voltage as a result of subtracting the output voltage of the loop filter 34 from the direct-current voltage corresponding to Δfr is input, and a saw-tooth wave of a frequency in accordance with a value of the voltage is output from the DDS circuit section 36. For easier understanding of an operation of the PLL, states of outputs of the respective sections are quite schematically shown in FIG. 4, and for instinctive grasping thereof, quite schematic descriptions are given. At a time of starting the device, the direct-current voltage corresponding to Δfr is input into the DDS circuit section 36 through the adding section 35, and, if Δfr is 5 MHz, for example, a saw-tooth wave of a frequency in accordance with the frequency is output from the DDS circuit section 36.

Figure 5:
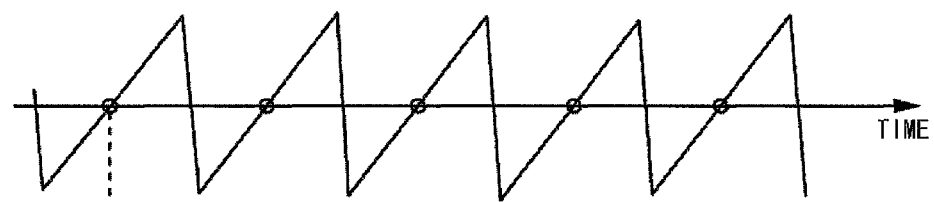
FIGS. 5(a), 5(b) and 5(c) are waveform diagrams of the respective sections schematically showing a locked state in the loop including the DDS circuit section shown in FIG. 2.
Figure 5:
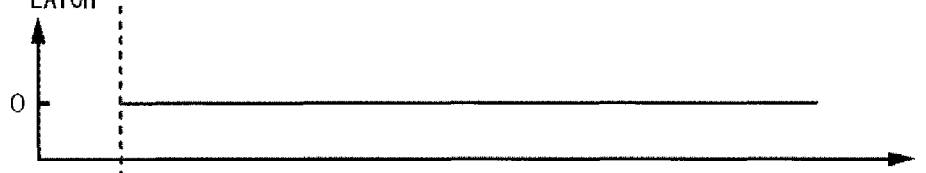
Figure 5:
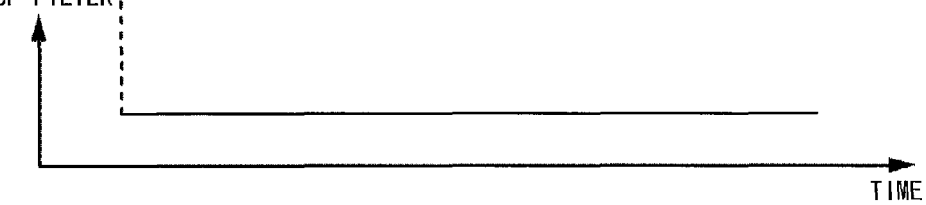

The saw-tooth wave is latched by the latch circuit 33 based on a pulse of frequency corresponding to (f2−f1), and, if (f2−f1) is 6 MHz, for example, a period of the pulse for latch is shorter than that of the saw-tooth wave, so that a latch point of the saw-tooth wave is gradually lowered as shown in FIG. 4(a), and the output of the latch circuit 33 and the output of the loop filter 34 are gradually lowered on the − side as shown in FIGS. 4(b) and 4(c). Since the sign in the adding section 35 on the output side of the loop filter 34 is "−", the direct-current voltage input into the DDS circuit section 36 from the adding section 35 increases. Accordingly, the frequency of the saw-tooth wave output from the DDS circuit section 36 becomes high, and when the direct-current voltage corresponding to 6 MHz is input into the DDS circuit section 36, the frequency of the saw-tooth wave becomes 6 MHz, and the PLL is locked as shown in FIGS. 5(a) to 5(c). The direct-current voltage output from the loop filter 34 at this time takes a value corresponding to Δfr−(f2−f1)=−1 MHz. Specifically, it can be said that an integral value of the loop filter 34 corresponds to an integral value of an amount of change of 1 MHz when the frequency of the saw-tooth wave is changed from 5 MHz to 6 MHz.

Figure 6:
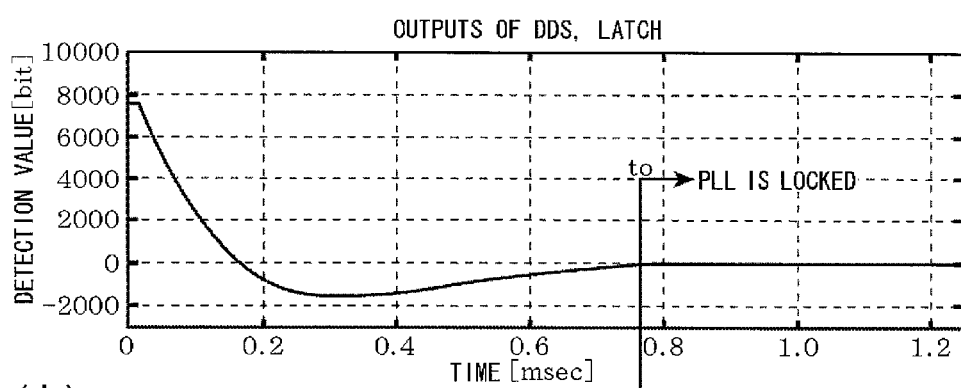
FIGS. 6(a) and 6(b) are waveform diagrams of the respective sections in the loop in an actual device corresponding to the aforementioned embodiment.
Figure 6:
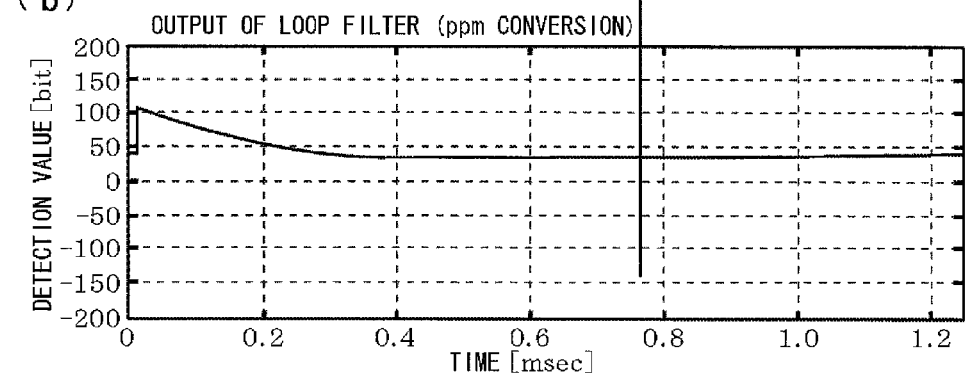

Contrary to this example, when Δfr is 6 MHz, and (f2−f1) is 5 MHz, since the period of pulse for latch is longer than that of the saw-tooth wave, the latch point shown in FIG. 4(a) becomes gradually high, and in accordance with this, the output of the latch circuit 33 and the output of the loop filter 34 are also increased. Accordingly, since the value to be subtracted in the adding section 35 becomes large, the frequency of the saw-tooth wave is gradually lowered, and when the frequency soon reaches 5 MHz being the same frequency as that of (f2−f1), the PLL is locked. The direct-current voltage output from the loop filter 34 at this time takes a value corresponding to Δfr−(f2−f1)=1 MHz. Note that FIG. 6 shows actual measured data, and in this example, the PLL is locked at a time t0.

Incidentally, as described above, the output of the frequency difference detecting unit 3, namely, an output of an averaging circuit 37 shown in FIG. 2 is actually a value that represents the value of $\{(f2-f1)/f1\}-\{(f2r-f1r)/f1r\}$ by a 34-bit digital value. If it is set that $(f1-f1r)/f1=OSC1$ (a unit thereof is ppm or ppb), and $(f2-f2r)/f2r=OSC2$ (a unit thereof is ppm or ppb), a change in an aggregation of the value from the vicinity of −50° C. to the vicinity of 100° C. with respect to the temperature forms substantially the same curve as that of OSC2−OSC1. Therefore, the output of the frequency difference detecting unit 3 can be treated such that OSC2−OSC1=temperature data.

Further, since the operation of latching f2 based on f1 in the flip-flop 31 is asynchronous, there is a possibility that an indefinite interval such as metastable (a state in which, when input data is latched at an edge of clock, the input data has to be held for a given period of time before and after the edge at which the latch is performed, but, the clock and the input data change at substantially the same time, so that an output becomes unstable) is generated, and thus an instantaneous error may be included in the output of the loop filter 34. For this reason, the averaging circuit 37 that determines a moving average of the input value at a previously set time is provided on an output side of the loop filter 34, and thereby the error is removed even if the aforementioned instantaneous error is generated. Although it is possible to obtain, conclusively, frequency deviation information corresponding to the amount of variation in temperature with high accuracy by providing the averaging circuit 37, it is also possible to adopt a structure in which the averaging circuit 37 is not provided.

Figure 7:
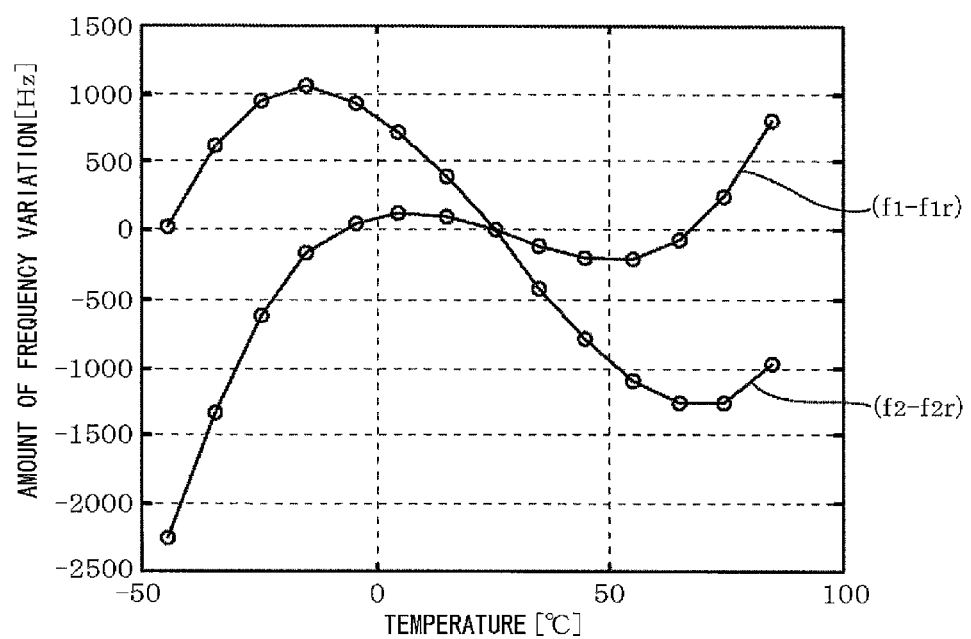
FIG. 7 is a frequency-temperature characteristic diagram showing relations between a frequency f1 of a first oscillation circuit and a temperature and between a frequency f2 of a second oscillation circuit and the temperature.

Here, the OSC2−OSC1 being the frequency deviation information corresponding to the amount of variation in temperature obtained with the loop filter 34 of the PLL will be described with reference to FIG. 7 to FIG. 10. FIG. 7 is a characteristic diagram showing a relation between the temperature and the frequency after normalizing f1 and f2 using the reference temperature. The normalization described therein means to determine a relation between a deviation amount of frequency with respect to a frequency at a reference temperature and the temperature, by setting 25° C. to the reference temperature, for example, and setting, regarding the relation between the temperature and the frequency, the frequency at the reference temperature to zero. If the frequency at 25° C. in the first oscillation circuit 1 is set to f1r, and the frequency at 25° C. in the second oscillation circuit 2 is set to f2r, namely, if the values of f1, f2 at 25° C. are set to f1r, f2r, respectively, values on a vertical axis in FIG. 7 represent (f1−f1r) and (f2−f2r).

Figure 8:
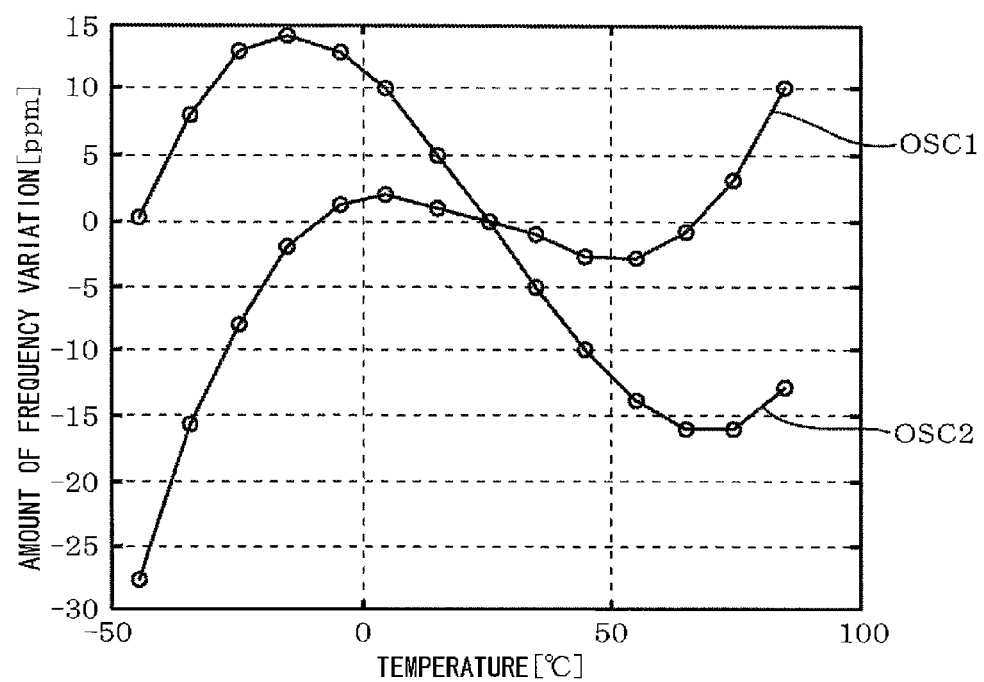
FIG. 8 is a frequency-temperature characteristic diagram showing a relation between a value obtained by normalizing a rate of change of the frequency f1 with a reference temperature value and a temperature, and a relation between a value obtained by normalizing a rate of change of the frequency f2 with the reference temperature value and the temperature.

Further, FIG. 8 represents a rate of change of the frequency at each temperature shown in FIG. 7 with respect to the frequency at the reference temperature (25° C.). Therefore, values on a vertical axis of FIG. 8 are (f1−f1r)/f1r and (f2−f2r)/f2r, and namely are OSC1 and OSC2 as described previously. Note that a unit of the value on the vertical axis in FIG. 8 is ppm.

Figure 9:
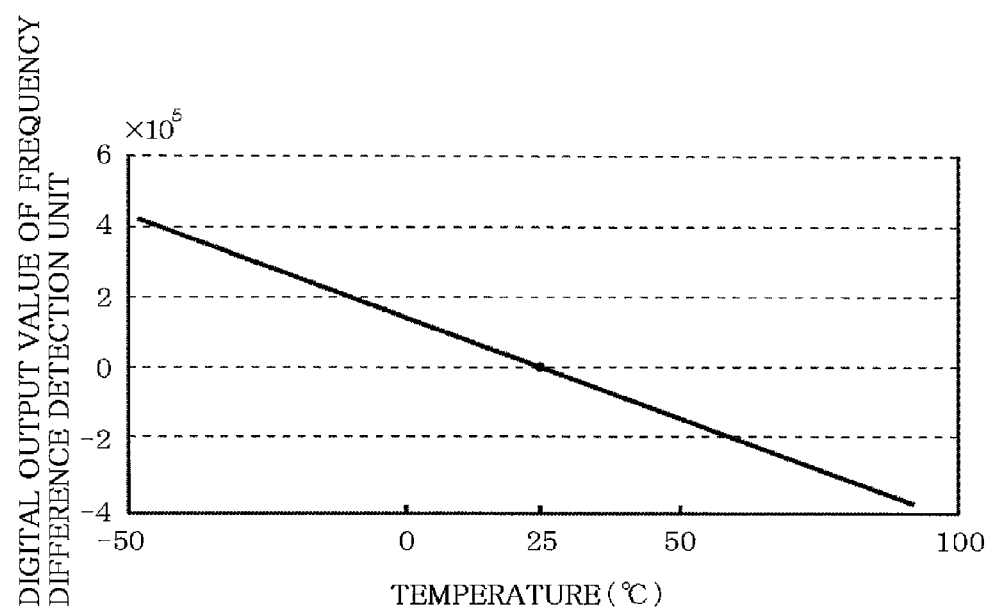
FIG. 9 is a characteristic diagram showing a relation between a digital output value from a frequency difference detection unit and a temperature.

FIG. 9 shows a relation between OSC1 and the temperature (which is the same as FIG. 8), and a relation between (OSC2−OSC1) and the temperature, in which it can be understood that (OSC2−OSC1) is in a linear relation with respect to the temperature. Therefore, it can be understood that (OSC2−OSC1) corresponds to the amount of deviation from the reference temperature due to the temperature variation.

Returning the descriptions to FIG. 1, the output value of the frequency difference detection unit 3 is substantially (OSC2−OSC1), it can be said that this value is a temperature detection value at which the quartz-crystal oscillators 10 and 20 are placed as shown in FIG. 9. Consequently, an adder (partial difference obtaining circuit) 6 is provided at a subsequent stage of the frequency difference detection unit 3 to obtain a difference between the temperature set value being a digital signal (34-bit digital value of (OSC2−OSC1) at set temperature), and (OSC2−OSC1) being the output of the frequency difference detection unit 3. As the temperature set value, it is preferred to select a temperature to which a value of OSC1 corresponding to the first quartz-crystal oscillator 10 for obtaining the output of the quartz-crystal controlled oscillator is not easily changed due to a temperature change. As the set temperature, a temperature, which is 50° C. for example, corresponding to a bottom portion in a relational curve between OSC1 and the temperature shown in FIG. 8 is selected. Note that a temperature which is 10° C. may be selected as the set temperature from a viewpoint that the value of OSC1 is the temperature which is not easily changed due to a temperature change. In this case, since the set temperature may be lower than room temperature, the temperature control section composed by combining a heating unit and a cooling unit (e.g., a Peltier device) may be provided.

Further, a loop filter 61 corresponding to an integration circuit section is provided at a subsequent stage of the adder 6.

Furthermore, a PWM wave interpolation section 62 is provided at a subsequent stage of the loop filter 61. The PWM wave interpolation section 62 performs conversion to represent a 14-bit digital signal (two's-complement numbers from $-2^{13}$ to $+2^{13}$) as a pulse signal during a given period of time. For example, when a minimum H pulse width is 10 ns, the digital signal is represented with a pulse number during the given period of time being $2^{14}*10^{-9}=16.384$ ms. Specifically, the pulse number is represented as follows. When the 14-bit digital value is zero, the H pulse number during 16.384 ms is $2^{13}$. When the 14-bit digital value is $-2^{13}$, the H pulse number during 16.384 ms is zero. When the 14-bit digital value is $2^{13}-1$, the H pulse number during 16.384 ms is $2^{14}-1$.

The low pass filter (LPF) 63 is provided at a subsequent stage of the PWM wave interpolation section 62, and averages an output from the PWM wave interpolation section 62 to output a direct-current voltage according to the pulse number which is the aforementioned output thereof. Specifically, in this example, the PWM wave interpolation section 62 and the low pass filter 63 are for converting a digital value into an analog value, and may be replaced with a digital to analog converter instead of using the PWM wave interpolation section 62 and the low pass filter 63.

Figure 10:
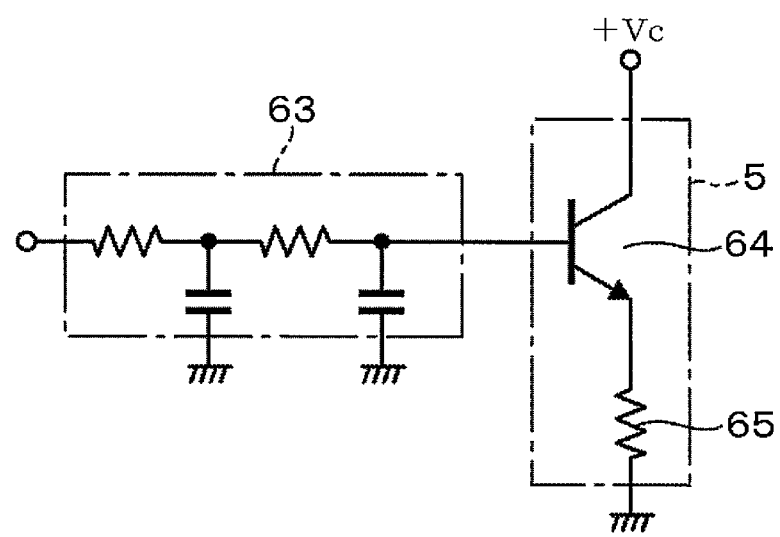
FIG. 10 is a circuit diagram showing a control circuit of a heating unit.

In FIG. 10, a heating circuit 5 corresponding to a heating unit is provided at a subsequent stage of the low pass filter (LPF) 63. As shown in FIG. 10, the heating circuit 5 includes a transistor 64 in which an output terminal of the low pass filter 63 is connected to a base thereof and a voltage is supplied to a collector thereof from a power supply section Vc, and a resistance 65 connected between an emitter of the transistor 64 and the ground. The relation between the voltage supplied to the base of the transistor 64, and the total power of electric power consumption of the transistor 64 and electric power consumption of the resistance 65 is linear relation. For this reason, heating temperature is controlled linearly according to a difference between the temperature data and the temperature set value as described above. In this example, since the transistor 64 is also a part of heating element, it is represented as the heating circuit 5 also serving as both of the heater and the heater control circuit.

Figure 11:
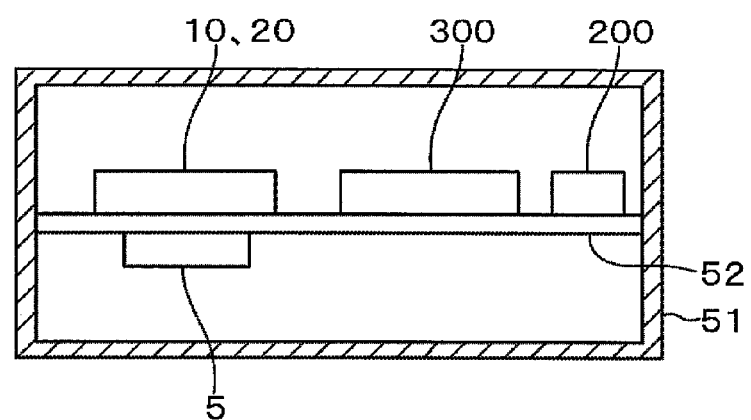
FIG. 11 is a schematic vertical-sectional side view diagram showing a structure of an oscillation device according to the aforementioned embodiment.

FIG. 11 is a diagram showing a schematic structure of the oscillation device shown in FIG. 1. Reference numeral 51 denotes a container, and reference numeral 52 denotes a printed circuit board provided in the container 51. A quartz-crystal oscillators 10 and 20, an integrated circuit unit 300, and the control circuit unit 200 etc. are provided on a top surface side of the printed circuit board 52. The integrated circuit unit 300 is a one-chip unit composed of a circuit performing digital processing and including the oscillation circuits 1 and 2, the frequency difference detection unit 3, etc. Further, the heater 5 is provided on the bottom surface side of the printed circuit board 52 (e.g., a position opposing the quartz-crystal oscillators 10 and 20), and the quartz-crystal oscillators 10 and 20 are held at a set temperature by heat generated by the heater 5.

Moreover, the oscillation device according to the embodiment also includes a temperature compensation unit that performs temperature compensation of the reference clock input into the control circuit unit 200, as described above. Specifically, the oscillation device of this example is composed by combining OCXO and TCXO. However, the oscillation device according to the present invention does not necessarily require the TCXO. The temperature compensation unit is composed of the quartz-crystal oscillators 10 and 20, the oscillation circuits 1 and 2, the frequency difference detection unit 3, and the compensation value calculating unit 4. Specifically, although the frequency difference detection unit 3 is a part of portion to perform temperature control of the heater 5, the frequency difference detection unit 3 is also a part of the aforementioned temperature compensation unit.

The frequency deviation information corresponding to the amount of variation in temperature obtained by the loop filter 34 of the PLL is input into a compensation value calculating unit 4, which is a compensation value obtaining unit, shown in FIG. 1, in which a compensation value of frequency is calculated. The frequency deviation information is as already described.

Figure 12:
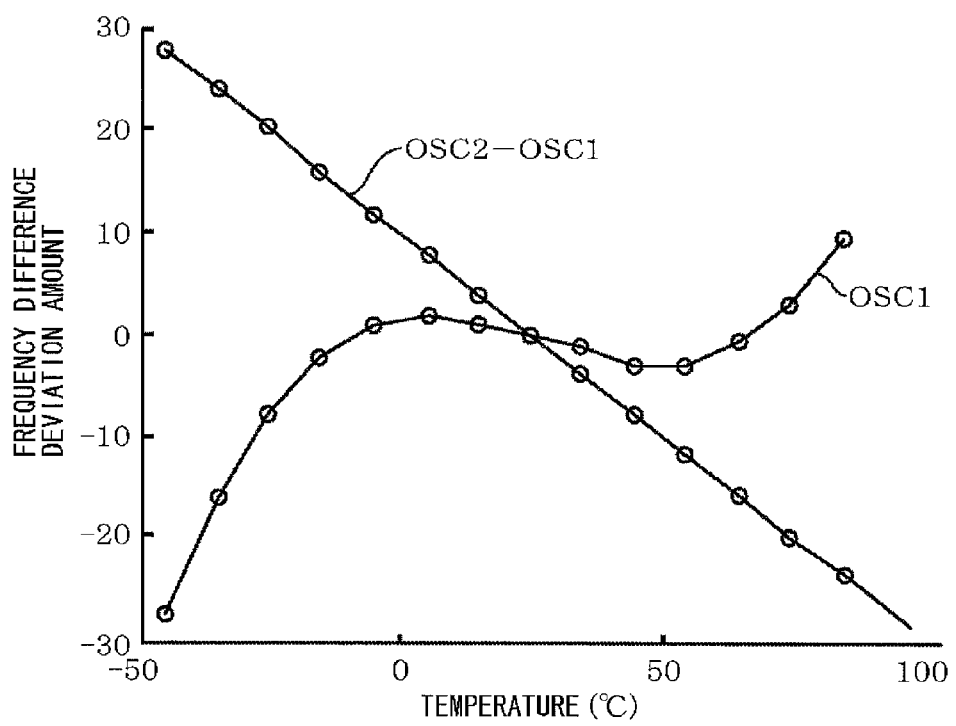
FIG. 12 is a frequency-temperature characteristic diagram showing a relation between the value obtained by normalizing the rate of change of the frequency f1 with the reference temperature value and the temperature, and a relation between a difference ΔF between the value obtained by normalizing the rate of change of the frequency f1 with the reference temperature value and the value obtained by normalizing the rate of change of the frequency f2 with the reference temperature value and the temperature.

FIG. 12 shows a relation between OSC1 and the temperature (which is the same as FIG. 8), and a relation between (OSC2−OSC1) and the temperature, in which it can be understood that (OSC2−OSC1) is in a linear relation with respect to the temperature. Therefore, it can be understood that (OSC2−OSC1) corresponds to the amount of deviation from the reference temperature due to the temperature variation. Further, generally, it is said that the frequency-temperature characteristic of the quartz-crystal oscillator is represented by a cubic function, if a relation between a frequency compensation value that cancels an amount of frequency variation obtained by the cubic function and (OSC2−OSC1) is determined, the frequency compensation value is determined based on a detection value of (OSC2−OSC1).

Figure 13:
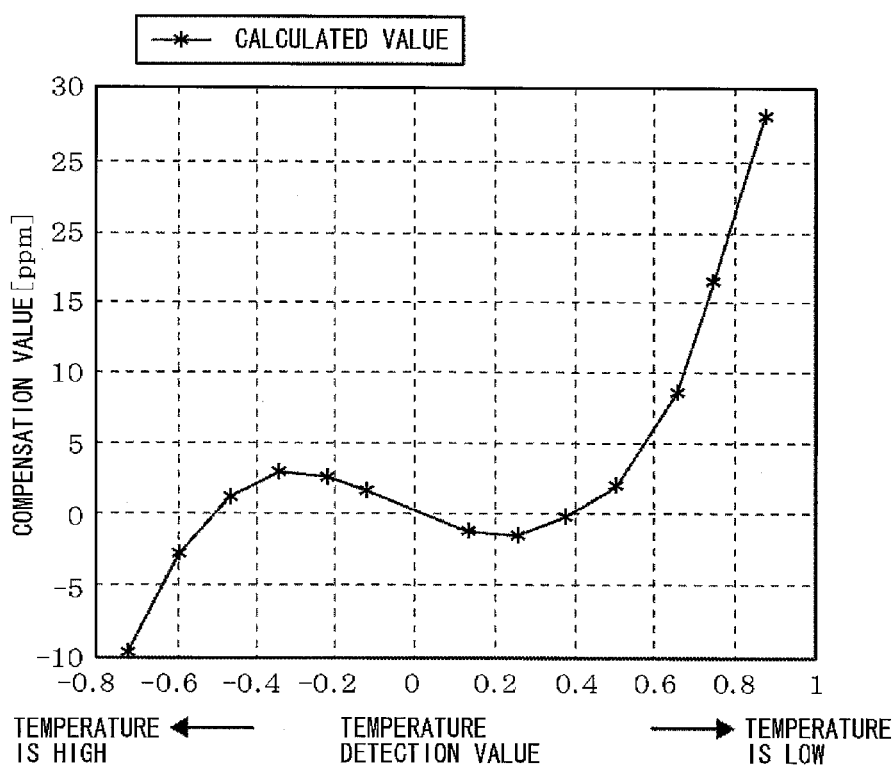
FIG. 13 is a characteristic diagram showing a relation between a value obtained by normalizing a vertical axis in FIG. 12 and a frequency compensation value.

As described above, the oscillation device of this embodiment uses the frequency signal obtained from the first oscillation circuit 1 (f1) as the reference clock of the control circuit unit 200 shown in FIG. 1, and the reference clock has the frequency-temperature characteristic, so that the temperature compensation is tried to be performed on the frequency of the reference clock. Accordingly, at first, a function representing a relation between the temperature and f1 normalized by the reference temperature is previously determined, and a function for cancelling the amount of frequency variation of f1 obtained by the function is determined as in FIG. 13. In for more details, f1 of the aforementioned function is equated to (f1−f1r)/f1r=OSC1 which is a rate of frequency variation at the reference temperature. Therefore, a vertical axis in FIG. 13 is −OSC1. In this example, the aforementioned function is set to a ninth-order function, for example, in order to perform the temperature compensation with high accuracy.

As described above, since the temperature and (OSC2−OSC1) are in the linear relation, a horizontal axis in FIG. 13 is the value of (OSC2−OSC1), but, if the value of (OSC2−OSC1) is used as it is, an amount of data for specifying the value becomes large, so that the value of (OSC2−OSC1) is normalized as described below. Specifically, an upper limit temperature and a lower limit temperature under which the oscillation device will be actually used are set, and a value of (OSC2−OSC1) at the upper limit temperature is treated as +1, and a value of (OSC2−OSC1) at the lower limit temperature is treated as −1. In this example, as shown in FIG. 13, −30 ppm is set as +1, and +30 ppm is set as −1.

The frequency characteristic with respect to the temperature in the quartz-crystal oscillator is treated as a ninth-order polynomial approximate expression, in this example. Concretely, when producing the quartz-crystal oscillator, a relation between (OSC2−OSC1) and the temperature is obtained through actual measurement, and from the actual measurement data, a curve of compensation frequency indicating a relation between the temperature and −OSC1 cancelling an amount of frequency variation with respect to the temperature is derived, and coefficients of the ninth-order polynomial approximate expression are derived through a least square method. Further, the coefficients of the polynomial approximate expression are previously stored in the memory 30 (refer to FIG. 1), and the compensation value calculating unit 4 performs calculation processing of an expression (1) by using these coefficients of the polynomial approximate expression.

$$Y = P1 \cdot X^9 + P2 \cdot X^8 + P3 \cdot X^7 + P4 \cdot X^6 + P5 \cdot X^5 \cdot P6 \cdot X^4 + P7 \cdot X^3 + P8 \cdot X^2 + P9 \cdot X \quad (1)$$

In the expression (1), X indicates frequency difference detection information, Y indicates compensation data, and P1 to P9 indicate the coefficients of the polynomial approximate expression.

Here, X is the value obtained by the frequency difference detecting unit 3 shown in FIG. 1, namely, the value (OSC2−OSC1) obtained by the averaging circuit 37 shown in FIG. 2.

Figure 14:
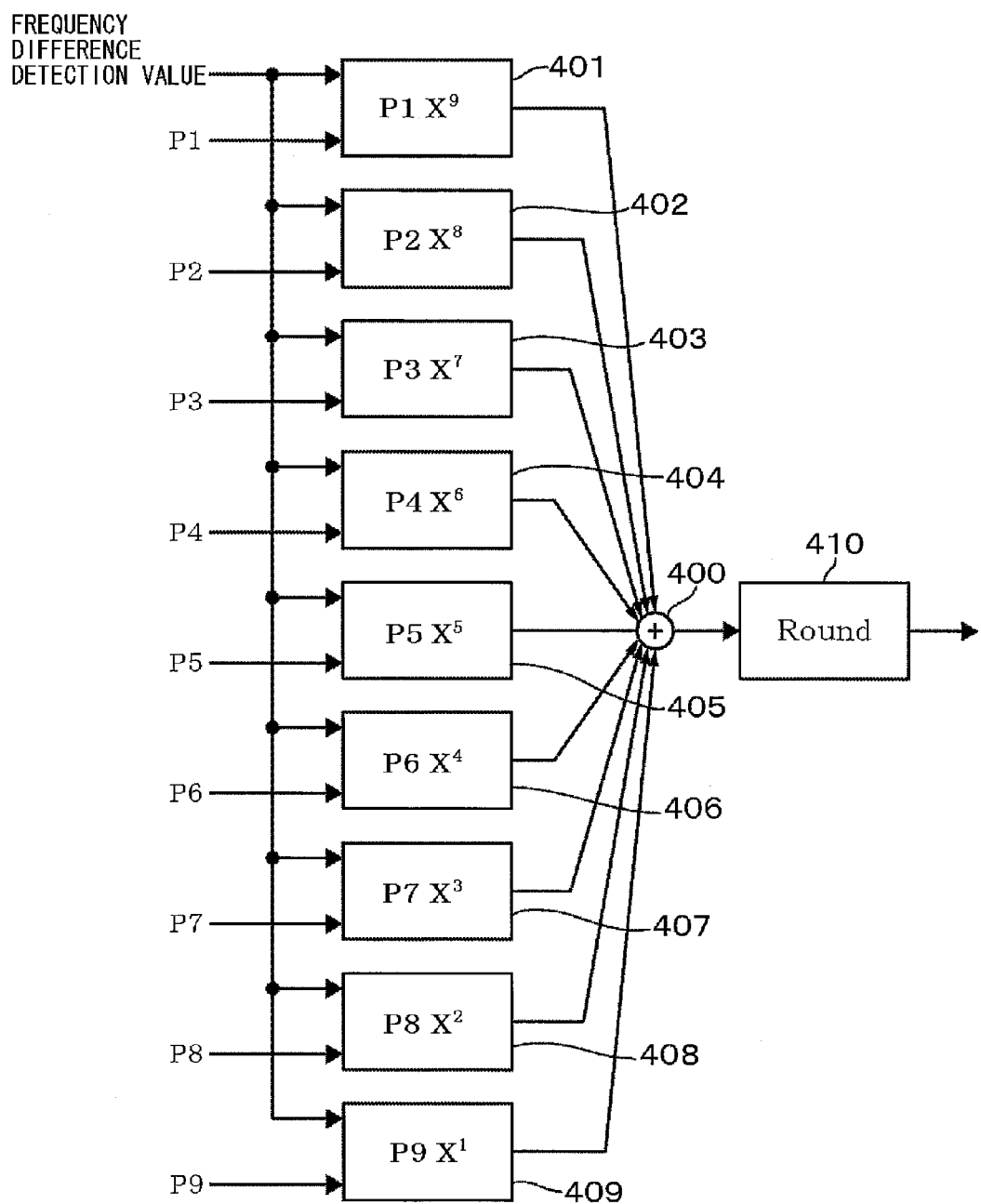
FIG. 14 is a block diagram showing a compensation value calculating unit.

An example of block diagram for executing the calculation in the compensation value calculating unit 4 is shown in FIG. 11. In FIG. 14, reference numerals 401 to 409 denote calculating sections that perform the calculation of respective terms in the expression (1), reference numeral 400 denotes an adding section, and reference numeral 410 denotes a circuit that performs round processing. Note that it is also possible to structure the compensation value calculating unit 4 such that, for example, one multiplying section is used, a value of ninth-power term is determined in the multiplying section, and a value of eighth-power term is subsequently determined in the multiplying section, namely, the multiplying section is used in a sort of repeated manner, and values of respective power terms are finally added. Further, the arithmetic expression of the compensation value is not limited to the use of the ninth-order polynomial approximate expression, but it is also possible to use an approximate expression of an order in accordance with a required accuracy.

Next, the entire operation of the aforementioned embodiment will be summarized. If paying attention to the quartz-crystal controlled oscillator of the oscillation device, the output of the quartz-crystal controlled oscillator is equivalent to the frequency signal output from the first oscillation circuit 1. Then, an atmosphere temperature at which the quartz-crystal oscillators 10 and 20 are placed is heated by the heater 5 until the set temperature is reached. Although the first quartz-crystal oscillator 10 and the first oscillation circuit 1 generate the frequency signal being the output of the quartz-crystal controlled oscillator, the first quartz-crystal oscillator 10 and the first oscillation circuit 1 also act as a temperature detecting unit in concert with the second quartz-crystal oscillator 20 and the second oscillation circuit 2. The value (OSC2−OSC1) corresponding to the frequency difference between the frequency signals respectively obtained from the oscillation circuits 1 and 2 corresponds to the temperature as described above, a difference between the temperature set value (e.g., a value of (OSC2−OSC1) at 50° C.) and the value (OSC2−OSC1) is obtained by the adding section.

This difference is integrated by the loop filter 61, and then is converted into a direct-current voltage so as to adjust a control power of the heater 5. As clearly from the characteristic diagram shown in FIG. 9, if the value of OSC1 at the time of 50° C. is set to $-1.5 \times 10^5$, the output of the adder 6 becomes a positive value when the temperature is lower than 50° C., and becomes large as the temperature is decreased. Therefore, it acts so that the control power of the heater 5 will become large as the atmosphere temperature at which the quartz-crystal oscillators 10 and 20 are placed is decreased below 50° C. Further, the output of the adder 6 becomes a negative value when the atmosphere temperature is higher than 50° C., and the absolute value thereof will become large as the temperature is increased. Therefore, it acts so that a power supplied to the heater will become small as the temperature is increased above 50° C. For this reason, since the atmosphere temperature at which the quartz-crystal oscillators 10 and 20 are placed tends to be held at 50° C. which is the set temperature, the output frequency from the first oscillator 1 being an oscillation output is stabilized. As a result, in the control circuit unit 200 using the output from the first oscillator 1 as a clock signal, since the frequency of the reference signal supplied to the phase comparison unit 205 is stabilized, the output frequency from the voltage controlled oscillator 100 being an output of the oscillation device (frequency synthesizer) is also stabilized.

Meanwhile, the output (OSC2−OSC1) from the frequency difference detection unit 3 is input into the compensation value calculating unit 4, the calculation in the expression (1) as described above is executed therein, resulting in that an amount of frequency compensation being temperature compensation data is obtained. The calculation in the expression (1) is processing for determining, in the characteristic diagram shown in FIG. 13, the value on the vertical axis of the curve of compensation frequency corresponding to the value obtained based on the output value of the frequency difference detecting unit 3, for example.

As shown in FIG. 1, the first quartz-crystal oscillator 10 and the second quartz-crystal oscillator 20 are structured by using the common quartz-crystal piece Xb, and are thermally coupled to each other, so that the frequency difference between the oscillation circuits 1 and 2 takes a value which corresponds to the ambient temperature quite accurately, and accordingly, the output of the frequency difference detecting unit 3 is temperature difference information between the ambient temperature and the reference temperature (25° C., in this example). The frequency signal f1 output from the first oscillation circuit 1 is used as the main clock of the control unit 200, so that the compensation value obtained by the compensation value calculating unit 4 is used as a signal for compensating the operation of the control unit 200 for cancelling the influence on the operation of the control circuit unit 200 based on the amount of frequency deviation of f1 due to the deviation of temperature from 25° C. As a result of this, the output frequency of the voltage controlled oscillator 100 being the output of the oscillation device of the present embodiment becomes stable regardless of the temperature variation.

As mentioned above, according to the above-mentioned embodiment, both of the differences between the values corresponding to the frequency differences between the frequency signals obtained from each of the quartz-crystal oscillators 10 and 20 is used as the temperature detection value, and thereby the heater 5 managing the atmosphere temperature of the quartz-crystal oscillators 10 and 20 is controlled based on the aforementioned temperature detection value. For this reason, the atmosphere temperature can be held at set temperature with high accuracy, and thereby the output of the quartz-crystal controlled oscillator (output of the first oscillation circuit 1) is stabilized.

Furthermore, according to this embodiment, the output of the quartz-crystal controlled oscillator is supplied as a clock signal to the control circuit unit 200 creating the oscillation output of the frequency synthesizer being an oscillation device, and the aforementioned clock signal is compensated using the value corresponding to the frequency difference. Specifically, the frequency synthesizer adds the compensation value obtained by the compensation value calculating unit 4 to the frequency set value of the DDS 201, and performs temperature compensation of a main clock (f1) input into the DDS 201. Thus, since the frequency synthesizer is provided with the functions of both OCXO and TCXO, there are the following advantages. Although a manufacturer determines the operating temperature range of the frequency synthesizer, an output frequency is stable even when a user uses the frequency synthesizer in the environment in which the operating temperature falls outside the range. Further, when the temperature set value of the heater is set to a higher temperature to raise an upper limit of the operating temperature range, the electric power consumption of the heater is increased, and size of the heating circuit also becomes large, but there is an advantage that the electric power consumption of the heater can be reduced by using the function of TCXO.

Figure 15:
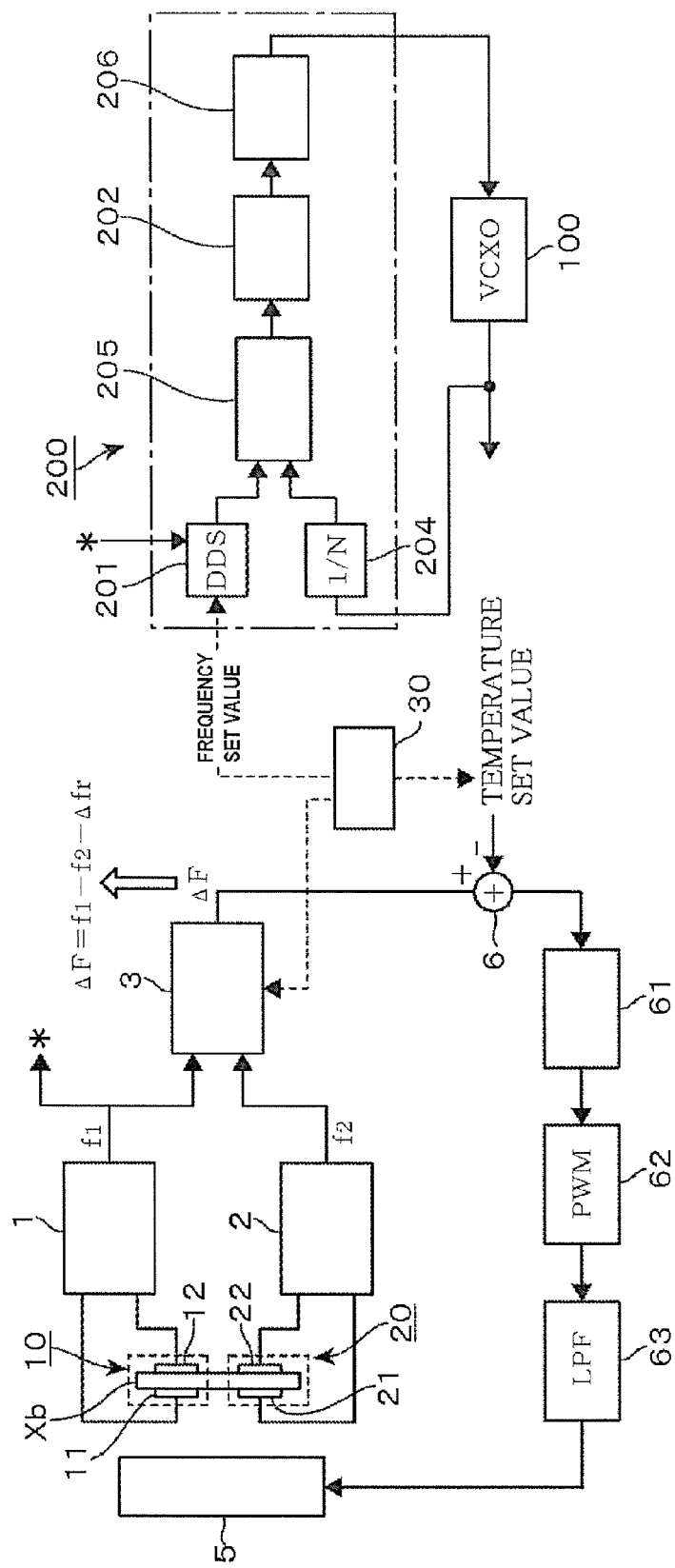
FIG. 15 is a block diagram showing an entire structure of other embodiments of the present invention.

However, as for the frequency synthesizer, it is also possible to adopt a structure not including the compensation value calculating unit 4 (a structure not having the function of TCXO), as shown in FIG. 15. Also in this case, a value corresponding to a difference between the value corresponding to the difference between f1 and f1$r$, and the value corresponding to the difference between f2 and f2$r$ is treated as a temperature at that time. Since the correlation degree between these value and temperature is quite high degree, the atmosphere temperature at which the quartz-crystal oscillator is placed is quite stabilized by controlling the power supplied to the heating unit by applying the aforementioned value to the temperature detection value. As a result, an oscillation output with high stability can be obtained.

Here, the loop filter 61 is a circuit for determining a loop gain and loop damping, and coefficients of the loop gain and the loop damping can be respectively adjusted with digital values. It is possible to easily adjust coefficients for respective structures by digitizing the loop coefficient, even if the heat transfer coefficient is changed due to a structural change.

In the above-mentioned example, since each third overtone of the quartz-crystal oscillators 10 and 20 is obtained as an output frequency, and the frequency-temperature characteristics of the overtones have a large temperature change, it is a preferable aspect that the value corresponding to these differences can be highly sensitive to the temperature. However, each fundamental wave of the quartz-crystal oscillators 10 and 20 may be obtained as the output frequency, and the value corresponding to these differences may be used as the temperature value. Alternatively, the fundamental waves and the overtones may be respectively obtained from the one side and the other side of the quartz-crystal oscillators 10 and 20, and the value corresponding to these differences may be treated as the temperature value.

Moreover, in order to obtain the frequency difference detection information, the PLL is structured such that the pulse corresponding to the difference frequency between f1 and f2 is created, the saw-tooth wave signal output from the DDS circuit section is latched by the latch circuit based on the pulse, the value of the latched signal is integrated, the integral value is output as the frequency difference, and the difference between the output and the value corresponding to the difference between f1r and f2r is obtained to be input into the DDS circuit section. When, as in Patent Document 1 (Japanese Patent Application No. 2001-292030), counting f1 and f2 and obtaining a difference thereof, the count time directly influences on the detection accuracy, but, with the structure as described above, there is no such problem, and thus there is provided a high detection accuracy. Actually, when both the methods are compared through simulation, in which a count time of 200 ms is set in the method of counting the frequencies, there is obtained a result that the detection accuracy in the method of the present embodiment is higher than that of the other method by about 50 times.

The frequency difference detecting unit 3 may also use the difference value between (f1−f1r) and (f2−f2r) itself, as the value corresponding to the difference value between the value corresponding to the difference between f1 and f1r and the value corresponding to the difference between f2 and f2r, and in this case, the graph in FIG. 7 is utilized to determine the temperature.

In the aforementioned embodiment, in the explanation from FIG. 8 to FIG. 10, the amount of change in the frequency is displayed in the unit of "ppm", but, it is all treated as a binary number in an actual digital circuit, so that a frequency setting accuracy of the DDS circuit section 36 is calculated by the number of configuration bits, for example, 34 bits. There can be cited an example as follows, in which a clock of 10 MHz is supplied to the DDS circuit section 201 included in the control circuit unit 200 shown in FIG. 1, a variable frequency of the clock being 100 Hz.

[Variable Ratio Calculation]

100 Hz/10 MHz=0.00001

[ppm Conversion]

0.00001*1e6=10 [ppm]

[DDS Setting Accuracy Conversion]

0.00001*2^34≈171.799[ratio-34 bit(tentative name)]

In the above-described structure, the frequency setting accuracy can be represented by the following expression (2).

1×[ratio-34 bit]=10 M[Hz]/2^34≈0.58 m[Hz/bit]   (2)

Therefore, the expression of 100 [Hz]/0.58 m [Hz/bit] ≈171.799 [bit (ratio-34 bit)] is satisfied.

Further, 0.58 mHz can be calculated with respect to 10 MHz as the following expression (3).

0.58 m[Hz]/10 M[Hz]*1e9≈0.058[ppb]   (3)

Therefore, from the expressions (2), (3), a relation of expression (4) is satisfied.

1e9/2^34=0.058[ppb/ratio-34 bit]   (4)

Specifically, the frequency processed in the DDS circuit 36 is eliminated, and a relation with only the number of bits is satisfied.

Furthermore, in the aforementioned example, the first quartz-crystal oscillator 10 and the second quartz-crystal oscillator 20 use the common quartz-crystal piece Xb, but, it is also possible that the quartz-crystal piece Xb is not used in a shared manner. In this case, there can be cited an example in which the first quartz-crystal oscillator 10 and the second quartz-crystal oscillator 20 are disposed in a common casing, for example. With such structure, since both the oscillators are placed under substantially the same temperature environment, it is possible to achieve the similar effect.

The output signal of the DDS circuit section 36 of the frequency difference detecting unit 3 is not limited to the saw-tooth wave, and it is only required to be a frequency signal whose signal value repeatedly increases and decreases with time such as, for example, a sine wave.

Further, the frequency difference detecting unit 3 may also be structured to count f1 and f2 by using a counter, subtract a value corresponding to Δfr from a difference value between the count values, and output a value corresponding to the obtained count value.

In the above embodiment, the first quartz-crystal oscillator 10 and the first oscillation circuit 1 act as obtaining the temperature detection value, and act as creating the output of the quartz-crystal controlled oscillator. Specifically, the oscillation circuit 1 shares the oscillation circuit for detecting the temperature, and the oscillation circuit for output of the quartz-crystal controlled oscillator. However, in the present invention, it is also possible that, for example, three quartz-crystal oscillators and three oscillation circuit are prepared (e.g., a third quartz-crystal oscillator and a third oscillation circuit connected to the aforementioned quartz-crystal oscillator is prepared, in the structure shown in FIG. 1), an output of the third oscillation circuit is applied as an output of the quartz-crystal controlled oscillator, oscillation outputs of remaining first oscillation circuit and second oscillation circuit are input into the frequency difference detection unit, thereby obtaining the temperature detection value. In this case, if the combination of OCXO and TCXO is adopted, the output of the third crystal oscillation circuit is used as a clock of the DDS 201.

The frequency synthesizer being an oscillation device shown in FIG. 1 and FIG. 15 is structured using the quartz-crystal controlled oscillator according to the embodiment of the present invention composed of the quartz-crystal oscillators 10 and 20, the oscillation circuits 1 and 2, the frequency difference detection unit 3, and a portion from the adding section 6 to the heating circuit 5. However, the present invention is not limited to structuring as the frequency synthesizer, and it is also possible to adopt a structure in which the oscillation output of the first oscillation circuit 1 is applied as the output of the quartz-crystal controlled oscillator of the present invention (i.e., a structure not using the control circuit unit 200).

Further, in the present invention, it is also possible to include the function of the TCXO, even in the case where the oscillation output of the first oscillation circuit 1 is applied as the output of the quartz-crystal controlled oscillator in this way. More specifically, as an example, a temperature sensor (e.g., a thermistor) is used as a temperature detecting unit for detecting the atmosphere temperature at which the quartz-crystal oscillators 10 and 20 are placed to adjust the output of the quartz-crystal controlled oscillator based on the temperature detection value from the temperature detecting unit. For example, as for a quartz-crystal controlled oscillator using a Colpitts oscillation circuit, setup of the frequency is achieved by setup of control voltage. In this case, the oscillation frequency will change as the environmental temperature at which the quartz-crystal oscillator is placed changes from the reference temperature, but the amount of change of the oscillation frequency resulting from the temperature change is canceled by adding a compensation value of the control voltage generated based on the temperature detection value to the set value of the control voltage. An added value of the OCXO of the present invention becomes still much higher by structuring in this way.

WORKING EXAMPLE

Figure 16:
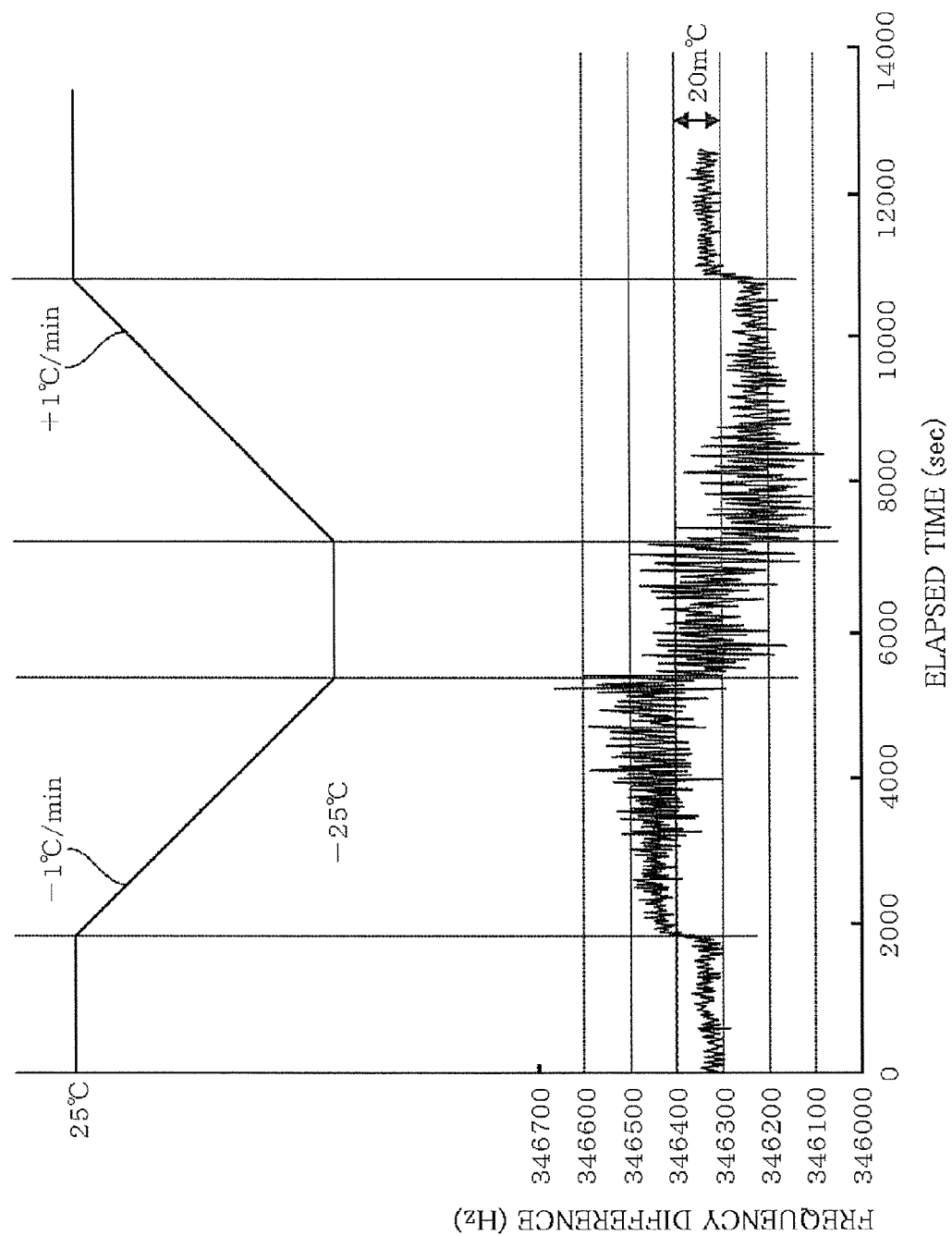
FIG. 16 is a ramp response diagram showing a frequency difference between two quartz-crystal oscillators when changing the temperature continuously.

A result shown in FIG. 16 was obtained, as a result of investigating a ramp response wave indicating transition of a frequency difference between two quartz-crystal oscillators 10 and 20 in the case of changing continuously the atmosphere temperature at which the quartz-crystal oscillators 10 and 20 are placed by gradient of 1° C./min, using the above-mentioned circuit shown in the embodiment. Each of f1 and f2 uses third overtone. In the graph shown in FIG. 16, one scale of the X-axis is equivalent to 20 m° C. (20° C./1000), it can verify offset of 20 m° C. when the temperature gradient is 1° C./min, and an amount of the offset can be reduced by rationalization of the coefficient of the loop filter 61.

Figure 17:
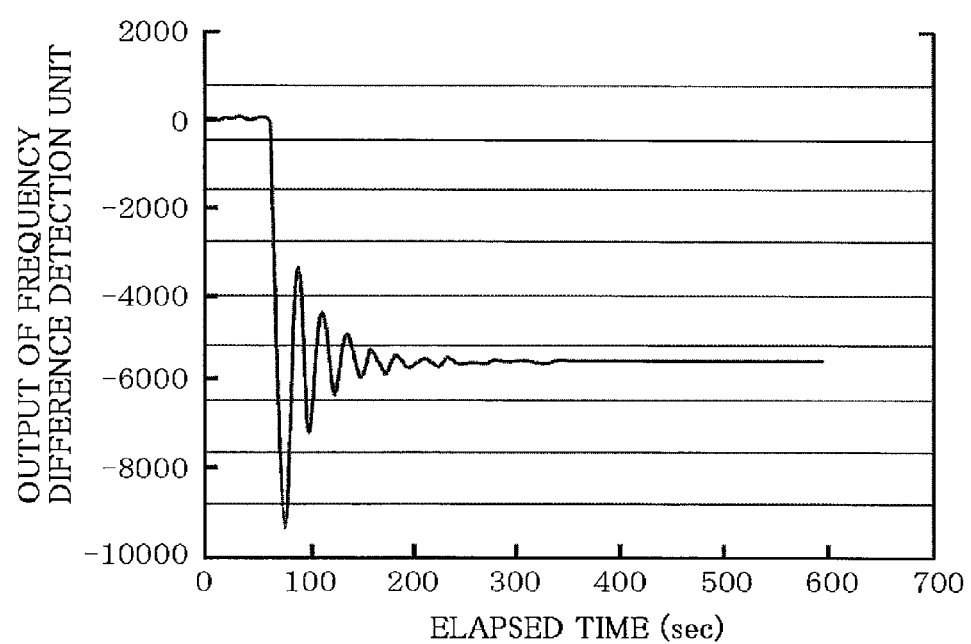
FIG. 17 is a step response diagram showing an output of a frequency difference detection unit when the temperature was changed 1° C.

Further, a result shown in FIG. 17 was obtained, as a result of investigating a step response wave indicating transition of the output of the frequency difference detection unit 3 in the case of changing 1° C. of the aforementioned atmosphere temperature. This result proves that the output of the frequency difference detection unit 3 (OSC2−OSC1) follows the temperature change. Note that an overshoot portion of the response waveform can be improved by adjusting the coefficient of the loop filter 61.

What is claimed is:

1. A quartz-crystal controlled oscillator comprising:
   an oscillation circuit for an oscillator output connected to a quartz-crystal oscillator;
   a heating unit keeping an atmosphere temperature at which the quartz-crystal oscillator is placed at a constant temperature;
   a first quartz-crystal oscillator structured by providing first electrodes on a first quartz-crystal piece;
   a second quartz-crystal oscillator structured by providing second electrodes on a second quartz-crystal piece;
   a first oscillation circuit and a second oscillation circuit connected to the first quartz-crystal oscillator and the second quartz-crystal oscillator, respectively;
   a frequency difference detecting unit determining, wherein when an oscillation frequency of the first oscillation circuit is set to f1, an oscillation frequency of the first oscillation circuit at a reference temperature is set to f1$r$, an oscillation frequency of the second oscillation circuit is set to f2, and an oscillation frequency of the second oscillation circuit at the reference temperature is set to f2$r$, a value corresponding to a difference value between a value corresponding to a difference between f1 and f1$r$, and a value corresponding to a difference between f2 and f2$r$ as a temperature detection value;
   an adding section obtaining a partial difference between a temperature set value of the atmosphere temperature at which the first quartz-crystal oscillator and the second quartz-crystal oscillator are placed and the temperature detection value; and
   a circuit section controlling an electric power supplied to the heating unit based on the partial difference obtained in the adding section.

2. The quartz-crystal controlled oscillator according to claim 1, wherein the oscillation circuit for an oscillation output, and one of the first oscillation circuit and the second oscillation circuit is shared.

3. The quartz-crystal controlled oscillator according to claim 1 further comprising an integration circuit section integrating the partial difference obtained by the adding section, and outputting the integrated partial difference to the circuit section.

4. The quartz-crystal controlled oscillator according to claim 1, wherein the value corresponding to the difference value between the value corresponding to the difference between f1 and f1$r$ and the value corresponding to the difference between f2 and f2$r$ is $[\{(f2-f2r)/f2r\}-\{(f1-f1r)/f1r\}]$.

5. The quartz-crystal controlled oscillator according to claim 1, wherein the first oscillation circuit and the second oscillation circuit apply an overtone as an oscillation output, respectively.

6. The quartz-crystal controlled oscillator according to claim 1, wherein the frequency difference detection unit comprises:
   a pulse creating section creating a pulse of a frequency corresponding to the difference between f1 and f2;
   a direct digital synthesizer (DDS) circuit section outputting a frequency signal whose signal value repeatedly increases and decreases with time by a frequency in accordance with a magnitude of an input direct-current voltage;
   a latch circuit latching, based on the pulse created by the pulse creating section, the frequency signal output from the DDS circuit section;
   a loop filter integrating a value of the latched signal latched by the latch circuit and outputting the integral value as the value corresponding to the difference value; and
   an adding section obtaining a difference between the output of the loop filter and a value corresponding to a difference between f1$r$ and f2$r$ to set the difference as an input value to be input into the DDS circuit section.

7. The quartz-crystal controlled oscillator according to claim 1 further comprising a temperature detecting unit detecting the atmosphere temperature at which the quartz-crystal oscillator is placed, wherein
   a set value of an output frequency of the quartz-crystal controlled oscillator is compensated based on the temperature detection value of the temperature detecting unit in order to cancel changes of the output frequency of the quartz-crystal controlled oscillator resulting from a point that an ambient temperature differs from the reference temperature.

8. An oscillation device comprising:

the quartz-crystal controlled oscillator according to claim 1; and a body circuit unit of the oscillation device including a phase locked loop (PLL), wherein the body circuit unit applies an oscillation output of the quartz-crystal controlled oscillator as a clock signal.

9. The oscillation device according to claim 7 further comprising:

a compensation value obtaining unit obtaining a frequency compensation value of the oscillation frequency of the oscillation circuit for an oscillation output resulting from a point that an ambient temperature differs from the reference temperature, based on a relation between the temperature detection value detected in the frequency difference detection unit, and the frequency compensation value between the temperature detection value and the oscillation frequency f1 of the oscillation circuit for an oscillation output; and a set value compensation unit compensating the frequency set value to be input the body circuit unit based on the frequency compensation value calculated by the compensation value obtaining unit.

* * * * *